United States Patent
Liu et al.

(10) Patent No.: US 8,518,775 B2
(45) Date of Patent: Aug. 27, 2013

(54) INTEGRATION OF ENVM, RMG, AND HKMG MODULES

(75) Inventors: Huang Liu, Singapore (SG); Alex Kai Hung See, Singapore (SG); Hai Cong, Singapore (SG); Zheng Zou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/251,444

(22) Filed: Oct. 3, 2011

(65) Prior Publication Data
US 2013/0082318 A1     Apr. 4, 2013

(51) Int. Cl.
*H01L 21/336*     (2006.01)
*H01L 29/66*     (2006.01)

(52) U.S. Cl.
USPC .................. 438/258; 257/234; 257/E27.084; 257/E21.209

(58) Field of Classification Search
CPC ... H01L 29/792; H01L 29/785; H01L 29/517; H01L 27/11568; H01L 27/115
USPC .................. 257/324, 369, E27.084, E21.209; 438/142, 187, 288, 585, 257, 258, 424
See application file for complete search history.

(56) References Cited

U.S. PATENT DOCUMENTS

2007/0252196 A1* 11/2007 Kim et al. .................. 257/329

* cited by examiner

*Primary Examiner* — Nikolay Yushin
(74) *Attorney, Agent, or Firm* — Ditthavong Mori & Steiner, P.C.

(57) ABSTRACT

A memory device is fabricated through the integration of embedded non-volatile memory (eNVM) with replacement metal gate (RMG) and high-k/metal gate (HKMG) modules. Embodiments include forming two substrate portions having upper surfaces at different heights, forming non-volatile gate stacks over the substrate portion with the lower upper surface, and forming high-voltage gate stacks and logic gate stacks over the other substrate portion. Embodiments include the upper surfaces of the non-voltage gate stacks, the high-voltage gate stacks, and the logic gate stacks being substantially coplanar.

18 Claims, 9 Drawing Sheets

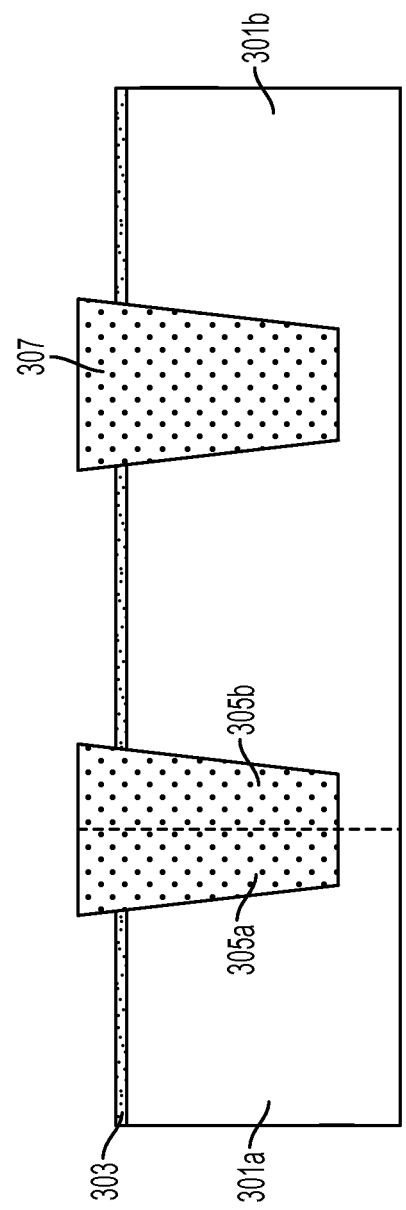

INTEGRATION OF ENVM, RMG, AND HKMG MODULES

TECHNICAL FIELD

The present disclosure relates to embedded non-volatile memory (eNVM) integration. The present disclosure is particularly applicable to eNVM in 32 nanometer (nm) technology nodes and beyond.

BACKGROUND

A typical eNVM integration flow produces a structure including a non-volatile gate stack along with high-voltage and logic gate stacks. Generally, the non-volatile gate stack is constructed with an oxide-nitride-oxide (ONO) stack in between two polysilicon layers, while the high-voltage and logic gate stacks are built with a single polysilicon layer, resulting in a step height difference between the upper surface of the non-volatile gate stack and the upper surfaces of the other gate stacks. As shown in FIG. 1, a version of a structure resulting from an eNVM integration scheme includes a substrate 101 with shallow trench isolation (STI) regions 103, source/drain regions 105, a non-volatile gate stack 107, high-voltage gate stacks 109, logic gate stacks 111, spacers 113, and various gate oxide layers 115. Non-volatile gate stack 107 includes an ONO stack 117 between two polysilicon layers 119. As discussed, because the high-voltage gate stacks 109 and the logic gate stacks 111 each include only one polysilicon layer 119, a step height difference 121 exists between the upper surface of the non-volatile gate stack 107 and the upper surfaces of the high-voltage and logic gate stacks 109 and 111, respectively.

In a conventional replacement metal gate (RMG) high-k/metal gate (HKMG) integration scheme, two chemical-mechanical polishing (CMP) steps are utilized. The first CMP step is performed prior to removing dummy polysilicon gate stacks, and the second CMP step is performed after the deposition of the HKMG gate stacks is complete. These two CMP steps require that the upper surfaces of the gate stacks be coplanar. Since the usual eNVM integration flow produces a step height difference 121 between the upper surface of the non-volatile gate stack 107 and the upper surfaces of the high-voltage and logic gate stacks 109 and 111, the eNVM integration flow is incompatible with an RMG HKMG integration scheme.

A need therefore exists for eNVM and RMG HKMG compatible integration schemes, and enabling methodology.

SUMMARY

An aspect of the present disclosure is a method for fabricating a memory device formed through integration of eNVM with RMG and HKMG modules.

Another aspect of the present disclosure is a memory device formed through integration of eNVM, RMG, and HKMG modules.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second portions in a substrate, the first portion having a first upper surface and the second portion having a second upper surface, wherein the first upper surface is higher than the second upper surface by a step height; forming a high-voltage gate stack having a third upper surface and a logic gate stack having fourth upper surface, both over the first substrate portion; and forming a non-volatile gate stack having a fifth upper surface over the second substrate portion.

Aspects of the present disclosure include having the third, fourth, and fifth upper surfaces be substantially coplanar. Another aspect includes having the high-voltage gate stack be a replacement metal gate (RMG) stack and the logic gate stack be a high-k/metal gate (HKMG) stack. Additional aspects include: forming the non-volatile gate stack with an oxide-nitride-oxide (ONO) stack between two polysilicon layers; and forming the step height to be substantially equal to a combined height of the ONO stack and one of the polysilicon layers. Other aspects include: forming the step height to 1000 Å to 1500 Å.

Further aspects of the present disclosure include: forming a shallow trench isolation (STI) region between the first substrate portion and the second substrate portion. Some aspects include extending the STI region 2000 Å to 8000 Å below the first upper surface. Other aspects include: forming a first portion in the STI region adjacent the first substrate portion and having a first STI upper surface higher than the first upper surface by a second step height; and forming a second portion in the STI region adjacent the second substrate portion and having a second STI upper surface higher than the second upper surface by a third step height. In certain embodiments, the second step height and the third step height are substantially the same.

An additional aspect of the present disclosure is a device including: a substrate with a first portion having a first upper surface and a second portion having a second upper surface, wherein the first upper surface is higher than the second upper surface by a step height; a high-voltage gate stack having a third upper surface and a logic gate stack having a fourth upper surface, both over the first substrate portion; and a non-volatile gate stack having a fifth upper surface over the second substrate portion.

Aspects include a device having the third, fourth, and fifth upper surfaces be substantially coplanar. Another aspect includes a device having the high-voltage gate stack be a replacement metal gate (RMG) stack and the logic gate stack be a high-k/metal gate (HKMG) stack. Additional aspects include a device having the non-volatile gate stack include an oxide-nitride-oxide (ONO) stack between two polysilicon layers, and the step height be substantially equal to a combined height of the ONO stack and one of the polysilicon layers. Other aspects include a device having the step height be 1000 Å to 1500 Å.

Further aspects include a device having a shallow trench isolation (STI) region between the first substrate portion and the second substrate portion. Some aspects include a device having the STI region extend 2000 Å to 8000 Å below the first upper surface. Other aspects include a device having: the STI region including a first STI portion having a first STI upper surface and a second STI portion having a second STI upper surface; the first STI upper surface being higher than the first upper surface by a second step height; and the second STI upper surface being higher than the second upper surface by a third step height. In certain embodiments, the second step height and the third step height are substantially the same.

Another aspect of the present disclosure includes: providing a substrate having a first portion and a second portion, the first portion having a first upper surface; etching the second portion of the substrate to form a second upper surface, the first upper surface being higher than the second upper surface by a step height; forming a high-voltage gate stack having a third upper surface and a logic gate stack having a fourth upper surface, both over the first portion; forming a non-volatile gate stack having a fifth upper surface over the second portion, the non-volatile gate stack including an oxide-nitride-oxide (ONO) stack between two polysilicon layers, wherein the step height is substantially equivalent to a combined height of the ONO stack and one of the polysilicon layers; and planarizing the third, fourth, and fifth upper surfaces to be substantially coplanar.

Further aspects include: forming a shallow trench isolation (STI) region between the first substrate portion and the second substrate portion and extending 2000 Å to 8000 Å below the first upper surface; and deglazing the STI region to form a first STI upper surface of a first portion of the STI region higher than the first upper surface by a second step height and a second STI upper surface of a second portion of the STI region higher than the second upper surface by the second step height.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3G schematically illustrate a process flow for integration of eNVM, RMG, and HKMG modules, in accordance with an embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems attendant upon incompatibility of conventional integration schemes, notably between eNVM and RMG HKMG schemes. The present disclosure addresses and solves such problem by, inter alia, forming two substrate portions having upper surfaces with different heights, forming non-volatile gate stacks over one of the substrate portions, and forming high-voltage gate stacks and logic gate stacks over the other substrate portion, thereby mitigating, or eliminating, the step height difference that typically exists between the upper surfaces of the non-volatile gate stacks and the respective high-voltage and logic gate stacks.

Figure 2:
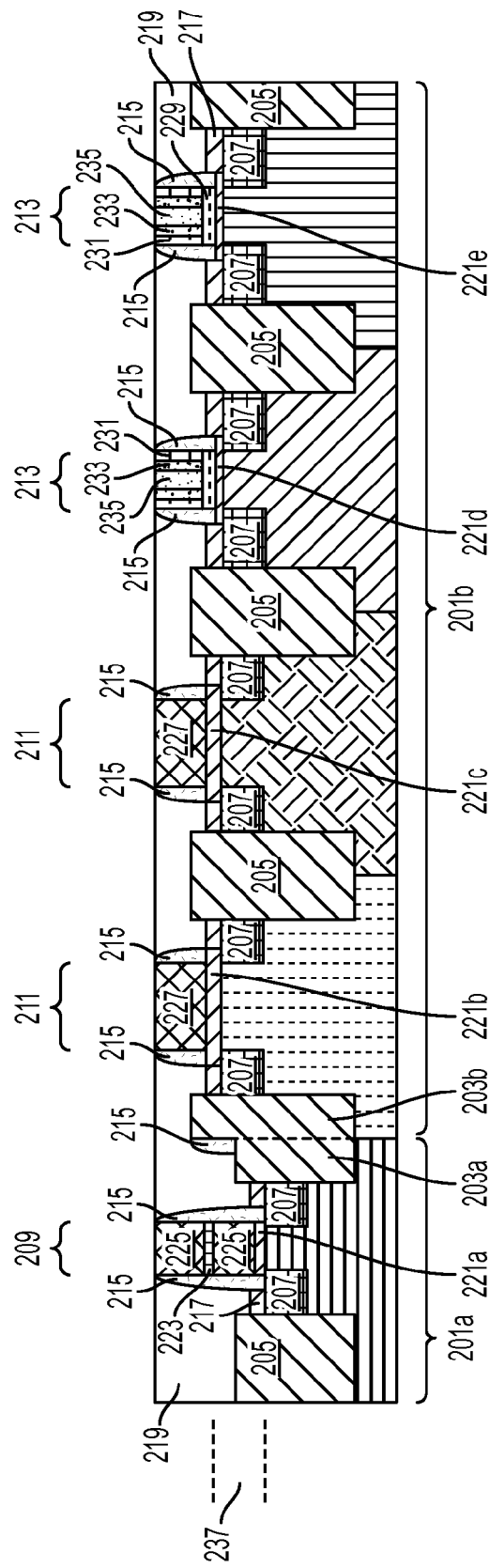
FIG. 2 schematically illustrates a structure formed through integration of eNVM, RMG, and HKMG modules, in accordance with an embodiment of the present disclosure.

FIG. 2 schematically illustrates a structure formed through integration of eNVM, RMG, and HKMG modules, in accordance with an embodiment of the present disclosure. The structure shown in FIG. 2 includes a substrate 201 (having substrate portions 201a and 201b), STI regions 203 (having STI portions 203a and 203b) and 205, source/drain regions 207, a non-volatile gate stack 209, high-voltage gate stacks 211, logic gate stacks 213, spacers 215, silicide layers 217, interlayer dielectric 219, and various gate oxide layers 221a through 221e. Non-volatile gate stack 209 includes an ONO stack 223 between two polysilicon layers 225. As shown, the high-voltage gate stacks 211 are RMG stacks and the logic gate stacks 213 are HKMG stacks. High-voltage gate stacks 211 may, for instance, include a thin polysilicon layer (not shown for illustrative convenience) under a metal gate 227, in which the polysilicon is leftover after removal of a dummy polysilicon gate during the RMG process. Logic gate stacks 213 may include a high-k dielectric layer 229, titanium nitride layers 231, seed/barrier layers 233, and a metal fill 235. Additionally, as illustrated, the gate oxide layers 117 may have varying thickness and materials for the different gate stack types (e.g., non-volatile gate stack 209, high-voltage gate stacks 211, and logic gate stacks 213). For example, gate oxide layer 221a may have a thickness of 1 nm to 2 nm, gate oxide layers 221b and 221c may have a thickness of 10 nm to 40 nm, and gate oxide layers 221d and 221e may have a thickness of 0.5 nm to 3 nm. The gate oxide materials can be traditional nitrigated oxide and/or high k materials.

Figure 1:
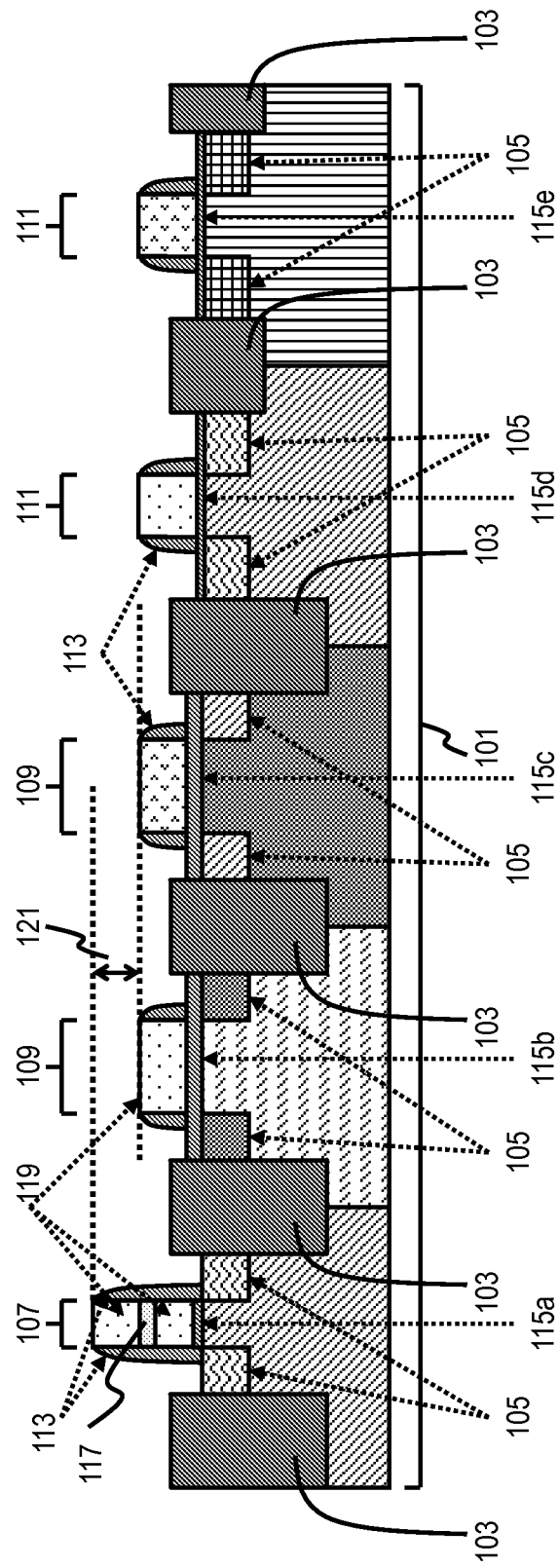
FIG. 1 schematically illustrates a background structure resulting from a typical eNVM integration flow.

Since the non-volatile gate stack 209 is intended to have an upper surface substantially coplanar with upper surfaces of the high-voltage gate stacks 211 and logic gate stacks 213, the RMG HKMG integration scheme may be incorporated to form the structure in FIG. 2. As illustrated in FIG. 2, the substrate portions 201a and 201b are formed to have respective upper surfaces with a step height difference 237. As such, the step height difference 121 in FIG. 1 does not exist between the upper surface of the non-volatile gate stack 209 and the upper surfaces of the high-voltage gate stacks 211 and the logic gate stacks 213. As discussed, the step height difference 237 may be substantially equal to the combined height of the ONO stack 223 and one of the polysilicon layers 225, for example, 1000 Å to 1500 Å.

FIGS. 3A through 3G schematically illustrate a process flow for integration of eNVM, RMG, and HKMG modules, in accordance with an embodiment of the present disclosure. Adverting to FIG. 3A, conventional processing may be performed to provide the substrate 301 (having substrate portions 301a and 301b), pad oxide layer 303 (e.g., SiO₂) over the substrate 301, and STI regions 305 (having STI portions 305a and 305b) and 307 embedded in the substrate 301. As shown, the STI region 305 may be formed between the substrate portions 301a and 301b. Embodiments include the STI regions 305 and 307 extending 2000 Å to 8000 Å below the upper surface of the substrate 301 (e.g., the upper surface of the substrate portion 301a). In this way, the STI regions extend deep enough to accommodate non-volatile and logic modules with respect to non-volatile and logic gate stacks (e.g., non-volatile and logic gate stacks 209 and 213, respectively).

Figure 3B:
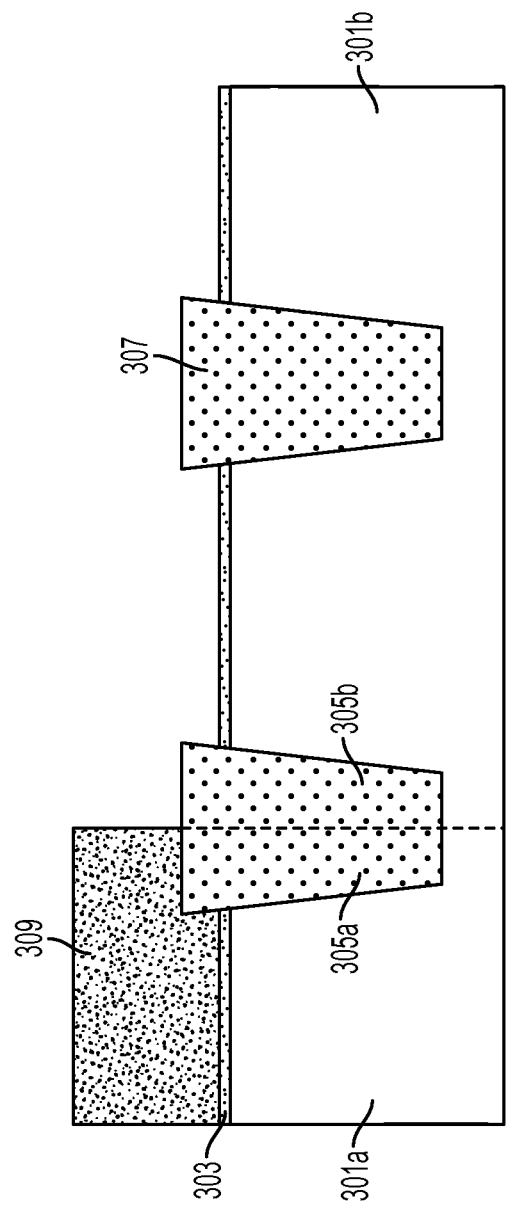
Figure 3C:
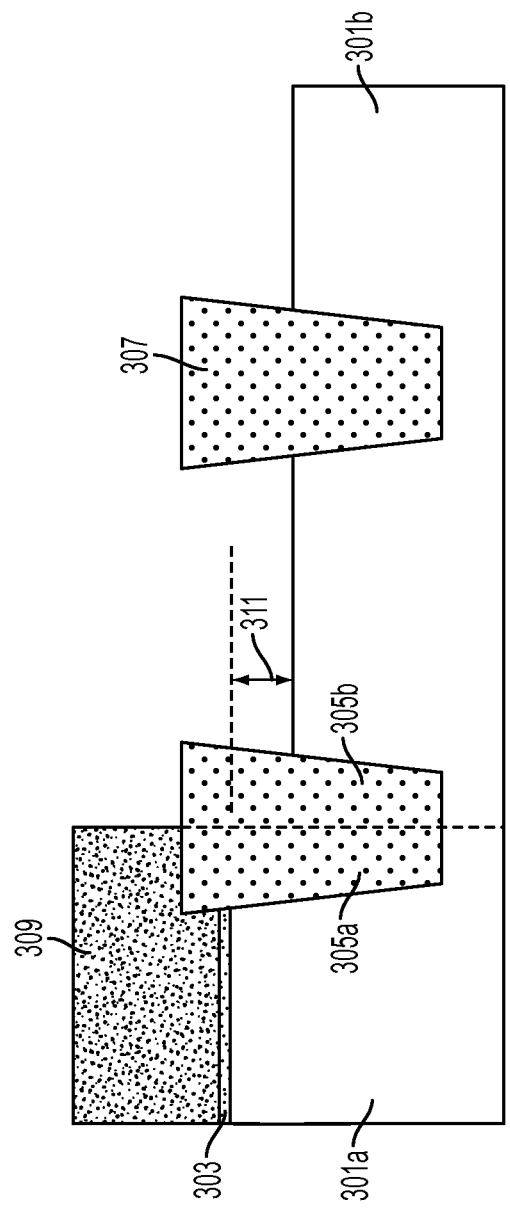

FIG. 3B illustrates depositing mask material 309 (e.g., photoresist) over the first substrate portion 301a. The portion of the pad oxide layer 303 over the second substrate portion 301b is then removed (e.g., by etching or cleaning via dilute hydrofluoric (dHF) acid, buffered hydrofluoric (BHF) acid, etc.). As illustrated in FIG. 3C, recessed etching (e.g., via reactive ion etching (RIE)) is performed on the substrate portion 301b until the upper surface of the substrate portion 301a is higher than the upper surface of the substrate portion 301b by a step height 311. In certain embodiments, the step height 311 may be substantially equal to a combined height of an ONO stack and a single polysilicon layer that will later form a part of a non-volatile gate stack (e.g., ONO stack 219 and one of the polysilicon layers 221 of the non-volatile gate stack 209) over the substrate portion 301b. For example, the step height 311 may be 1000 Å to 1500 Å.

Figure 3D:
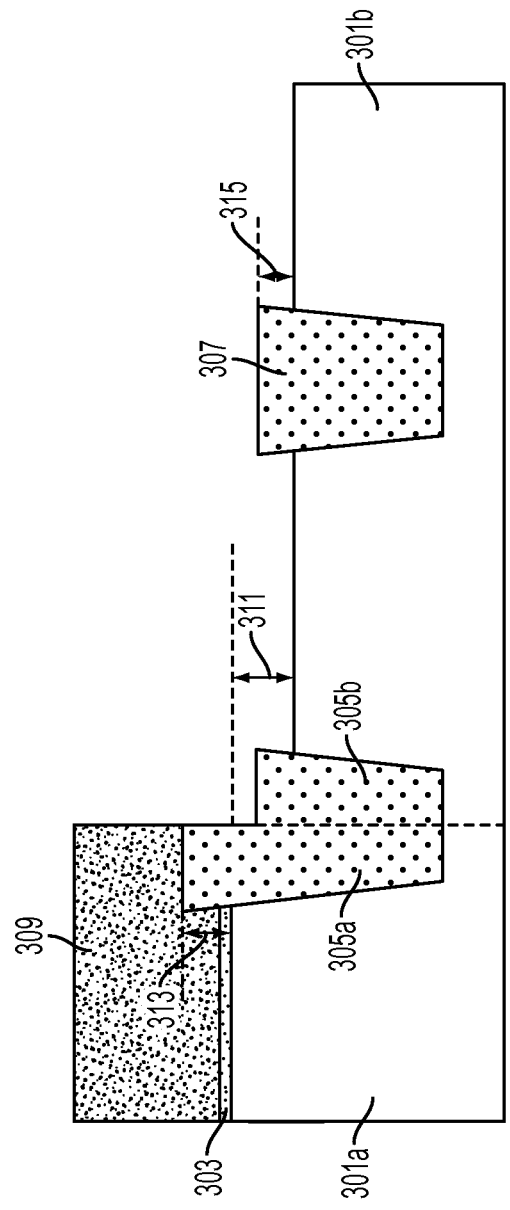

FIG. 3D illustrates deglazing the STI regions 305 and 307 of the substrate portion 301b so that the upper surface of the STI portion 305a is higher than the upper surface of the substrate portion 301a by a step height 313 and the upper surfaces of the STI portion 305b and the STI region 307 are higher than the substrate portion 301b by a step height 315. In some embodiments, the step height 313 may be 50 Å to 700 Å and the step height 315 may be 100 Å to 300 Å. In other embodiments, the step height 313 and 315 may be substantially the same.

Figure 3E:
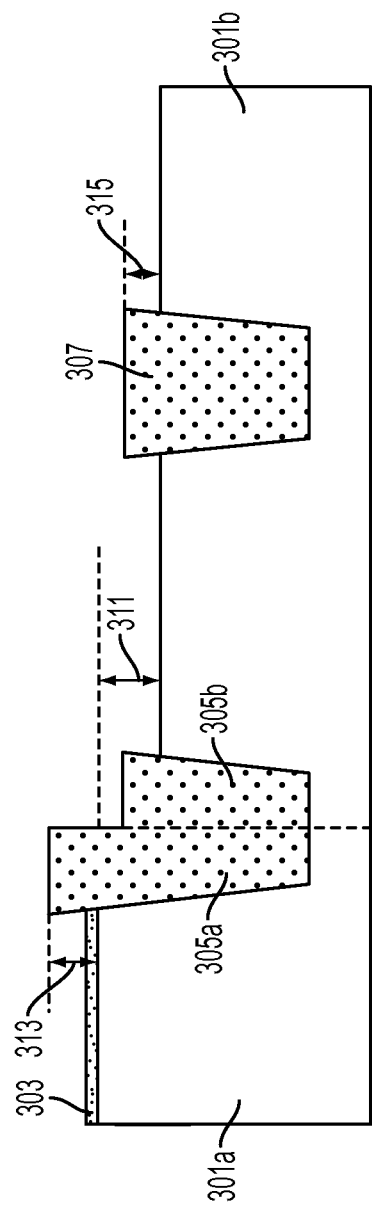
Figure 3F:
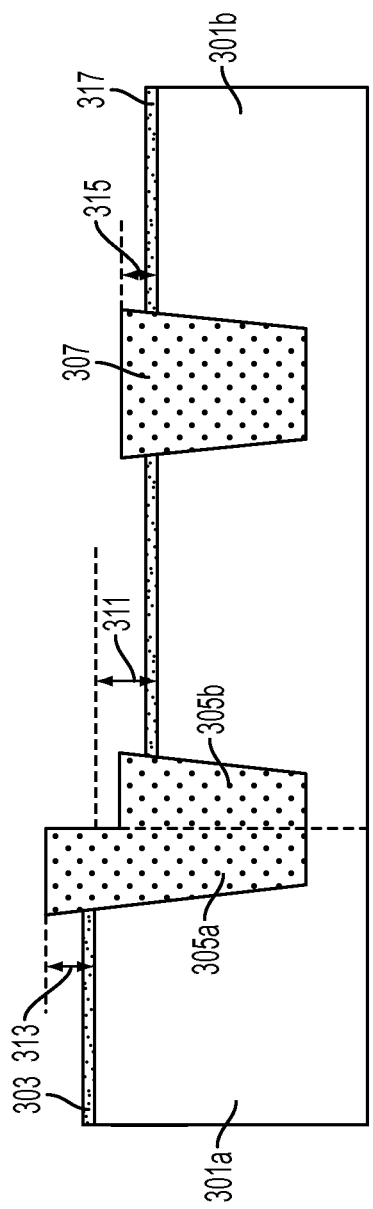
Figure 3G:
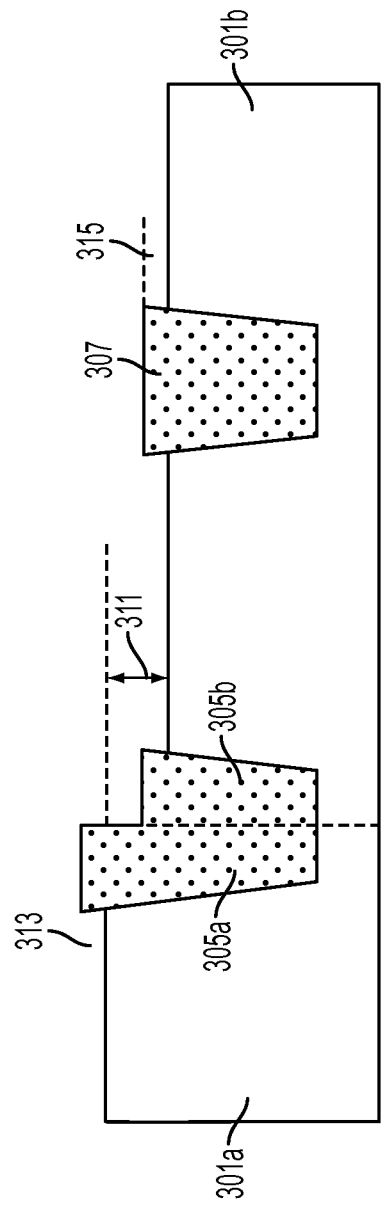

FIG. 3E illustrates removing the mask material 309 (e.g., via stripping and cleaning) As illustrated in FIG. 3F, a thermal oxide layer 317 (e.g., with a thickness of 50 Å to 500 Å) is then grown over the substrate portion 301b to help remove surface damage as a result of the etching process of FIG. 3C. FIG. 3G illustrates deglazing to remove the pad oxide layer 303 and the thermal oxide layer 317 as well as to control the step heights 313 and 315 to a target optimal STI region elevation (e.g., step heights from 50 Å to 300 Å). As discussed, step heights 313 and 315 may be substantially the same. Thereafter, further processing may be performed, via conventional methods, including RMG and HKMG processes, to produce the structure of FIG. 2.

The embodiments of the present disclosure can achieve several technical effects, including the integration of eNVM, RMG, and HKMG modules. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second substrate portions in a substrate, the first substrate portion having a first upper surface and the second substrate portion having a second upper surface, wherein the first upper surface is higher than the second upper surface by a step height;
   forming a high-voltage gate stack having a third upper surface and a logic gate stack having a fourth upper surface, both over the first substrate portion; and
   forming a non-volatile gate stack having a fifth upper surface over the second substrate portion,
   wherein the third, fourth, and fifth upper surfaces are substantially coplanar.

2. The method according to claim 1, comprising:
   forming the non-volatile gate stack with an oxide-nitride-oxide (ONO) stack between two polysilicon layers; and
   forming the step height to be substantially equal to a combined height of the ONO stack and one of the polysilicon layers.

3. The method according to claim 1, comprising forming the step height to 1000 Å to 1500 Å.

4. The method according to claim 1, comprising forming a shallow trench isolation (STI) region between the first substrate portion and the second substrate portion.

5. The method according to claim 4, comprising extending the STI region 2000 Å to 8000 Å below the first upper surface.

6. The method according to claim 4, comprising:
   forming a first portion in the STI region adjacent the first substrate portion and having a first STI upper surface higher than the first upper surface by a second step height; and
   forming a second portion in the STI region adjacent the second substrate portion and having a second STI upper surface higher than the second upper surface by a third step height.

7. The method according to claim 6, wherein the second step height and the third step height are substantially the same.

8. The method according to claim 1, wherein the high-voltage gate stack is a replacement metal gate (RMG) stack and the logic gate stack is a high-k/metal gate (HKMG) stack.

9. A device comprising:
   a substrate with a first substrate portion having a first upper surface and a second substrate portion having a second upper surface, wherein the first upper surface is higher than the second upper surface by a step height;
   a high-voltage gate stack having a third upper surface and a logic gate stack having a fourth upper surface, both over the first substrate portion; and
   a non-volatile gate stack having a fifth upper surface over the second substrate portion,
   wherein the third, fourth, and fifth upper surfaces are substantially coplanar.

10. The device according to claim 9, wherein the non-volatile gate stack includes an oxide-nitride-oxide (ONO) stack between two polysilicon layers, and the step height is substantially equal to a combined height of the ONO stack and one of the polysilicon layers.

11. The device according to claim 9, wherein the step height is 1000 Å to 1500 Å.

12. The device according to claim 9, further comprising a shallow trench isolation (STI) region between the first substrate portion and the second substrate portion.

13. The device according to claim 12, wherein the STI region extends 2000 Å to 8000 Å below the first upper surface.

14. The device according to claim 12, wherein:
   the STI region comprises a first STI portion having a first STI upper surface and a second STI portion having a second STI upper surface;

the first STI upper surface is higher than the first upper surface by a second step height; and the second STI upper surface is higher than the second upper surface by a third step height.

15. The device according to claim 14, wherein the second step height and the third step height are substantially the same.

16. The device according to claim 9, wherein the high-voltage gate stack is a replacement metal gate (RMG) stack and the logic gate stack is a high-k/metal gate (HKMG) stack.

17. A method comprising:
providing a substrate having a first portion and a second portion, the first portion having a first upper surface;
etching the second portion of the substrate to form a second upper surface, the first upper surface being higher than the second upper surface by a step height;
forming a high-voltage gate stack having a third upper surface and a logic gate stack having a fourth upper surface, both over the first portion;
forming a non-volatile gate stack having a fifth upper surface over the second portion, the non-volatile gate stack including an oxide-nitride-oxide (ONO) stack between two polysilicon layers, wherein the step height is substantially equivalent to a combined height of the ONO stack and one of the polysilicon layers; and
planarizing the third, fourth, and fifth upper surfaces to be substantially coplanar.

18. The method according to claim 17, comprising:
forming a shallow trench isolation (STI) region between the first substrate portion and the second substrate portion and extending 2000 Å to 8000 Å below the first upper surface; and
deglazing the STI region to form a first STI upper surface of a first portion of the STI region higher than the first upper surface by a second step height and a second STI upper surface of a second portion of the STI region higher than the second upper surface by the second step height.

* * * * *